(12) United States Patent
Kim et al.

(10) Patent No.: US 12,136,677 B2
(45) Date of Patent: *Nov. 5, 2024

(54) BACK CONTACT SOLAR CELL AND FABRICATION METHOD THEREOF

(71) Applicant: Shangrao Xinyuan YueDong Technology Development Co. Ltd, Jiangxi Province (CN)

(72) Inventors: Hwa Nyeon Kim, Seoul (KR); Ju Hwan Yun, Seoul (KR); Jong Hwan Kim, Seoul (KR); Bum Sung Kim, Seoul (KR); Ii Hyoung Jung, Seoul (KR); Jin Ah Kim, Seoul (KR)

(73) Assignee: Shangrao Xinyuan YueDong Technology Development Co. Ltd., Jiangxi Province (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,051

(22) Filed: Nov. 7, 2023

(65) Prior Publication Data

US 2024/0097061 A1 Mar. 21, 2024

Related U.S. Application Data

(63) Continuation of application No. 12/812,910, filed as application No. PCT/KR2008/006685 on Nov. 13, 2008, now Pat. No. 11,843,063.

(30) Foreign Application Priority Data

Feb. 25, 2008 (KR) .................. 10-2008-0016725

(51) Int. Cl.
*H01L 31/068* (2012.01)
*H01L 31/0216* (2014.01)
*H01L 31/0224* (2006.01)
*H01L 31/0236* (2006.01)
*H01L 31/18* (2006.01)

(52) U.S. Cl.
CPC ............. *H01L 31/022441* (2013.01); *H01L 31/02168* (2013.01); *H01L 31/0236* (2013.01); *H01L 31/02363* (2013.01); *H01L 31/02366* (2013.01); *H01L 31/0682* (2013.01); *H01L 31/18* (2013.01); *H01L 31/1804* (2013.01); *Y02E 10/547* (2013.01); *Y02P 70/50* (2015.11)

(58) Field of Classification Search
None
See application file for complete search history.

(56) References Cited

U.S. PATENT DOCUMENTS

| 4,927,770 A | * | 5/1990 | Swanson | ............... H01L 31/061 257/458 |
| 2006/0060238 A1 | * | 3/2006 | Hacke | ................ H01L 31/0682 438/98 |

* cited by examiner

*Primary Examiner* — Dustin Q Dam
(74) *Attorney, Agent, or Firm* — Pillsbury Winthrop Shaw Pittman, LLP

(57) ABSTRACT

The present invention discloses a back contact solar cell. The back contact solar cell includes a semiconductor substrate having a front surface and a rear surface; a first conductive type semiconductor region having a first conductive type and a second conductive type semiconductor region having a second conductive type at an interval on the rear surface of the semiconductor substrate. Furthermore, the rear surface of the semiconductor substrate has a texturing structure at the interval between the first conductive type semiconductor region and the second conductive type semiconductor region.

20 Claims, 6 Drawing Sheets

BACK CONTACT SOLAR CELL AND FABRICATION METHOD THEREOF

CROSS-REFERENCE TO RELATED APPLICATIONS

This application is a continuation of U.S. patent application Ser. No. 12/812,910 filed on Jan. 21, 2011, which is the national phase of PCT International Application No. PCT/KR2008/006685 filed on Nov. 13, 2008, which claims the benefit of Korean Patent Application No. 10-2008-0016725 filed on Feb. 25, 2008. The entire contents of all of the above applications are hereby incorporated by reference.

BACKGROUND OF THE INVENTION

Field of the Invention

The present invention relates to a fabrication method of a back contact solar cell, and in particular to a fabrication method of a back contact solar cell capable of simplifying a fabrication process thereof and also reducing fabrication costs thereof by forming a pattern for formation of a p-type semiconductor region and an n-type semiconductor region on a rear surface of the back contact solar cell by a laser method to allow a complicated process such as photolithography to be omitted.

Discussion of the Related Art

Recently, due to problems such as a rapid rise in oil prices, an environmental problem of the earth, exhaustion of fossil energy, waste treatment in nuclear power generation, position selection according to construction of a new power plant, etc., interest in renewable energy has increased and among others, research and development for a solar cell, which is a pollution-free energy source, has actively been progressed.

The solar cell, which is a device converting light energy into electrical energy using a photovoltaic effect, is divided into a silicon solar cell, a thin film solar cell, a dye sensitized solar cell, and an organic polymer solar cell, etc., according to type and configuration of materials. Such a solar cell is independently used as a main power supply in an electronic watch, a radio, a manless lighthouse, a satellite, a rocket, etc., and is also used as an auxiliary power supply in connection to a system of a commercial AC power supply. Recently, due to increase in the necessity for alternative energy, interest in the solar cell has increased.

Figure 1:
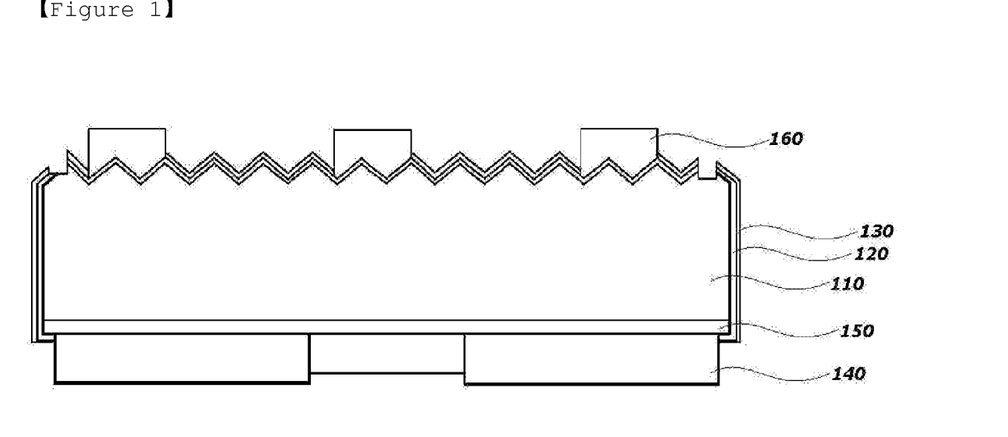
FIG. 1 is a cross-sectional view showing a structure of a conventional crystalline silicon solar cell.

A structure of a crystalline silicon solar cell firstly used among these solar cells and being also used to some degree in the current solar cell market is shown in FIG. 1. Hereinafter, a fabrication method of a conventional crystalline silicon solar cell will be described with reference to FIG. 1.

First, a texturing structure for minimizing reflectance of incident light is formed on a surface of a p-type silicon substrate 110. Thereafter, an n-type material such as $POC_3$ is thermally diffused onto a whole surface of the substrate 110 to form an n-type semiconductor layer 120, thereby forming a p-n junction.

Next, an anti-reflection coating 130 for minimizing the reflectance is formed on a surface, which is a light-receiving face in the substrate 110, that is, a surface to which solar light is incident. Thereafter, rear electrodes 140 such as an aluminum electrode, etc. are formed on a rear surface of the substrate 110 and at the same time, a rear electric field layer 150 is formed by thermally processing the rear surface of then-type semiconductor layer 120.

Finally, front electrodes 160 penetrating the anti-reflection coating 130 to reach to the n-type semiconductor layer 120 are formed to complete the crystalline silicon solar cell.

However, such a crystalline silicon solar cell has a disadvantage that since there are the front electrodes 160 formed in a metal finger line form on the surface to which the solar light is incident, that is, the light-receiving face side, it is impossible to avoid shadowing.

More specifically, the metal finger line is formed in a form protruded on the light-receiving face so that the shadowing is generated, wherein the shadowing reduces an area to which the solar light may be incident, thereby having a bad effect on efficiency of the solar cell.

For this reason, the crystalline silicon solar cell has a problem that it is difficult to generate a high efficiency of 18% or more. In order to solve the problem, a back contact solar cell has been designed.

FIGS. 2 to 10 show a fabrication process of a conventional back contact solar cell. Hereinafter, the fabrication process of the conventional back contact solar cell will schematically be described with reference to FIGS. 2 to 10.

Figure 2:
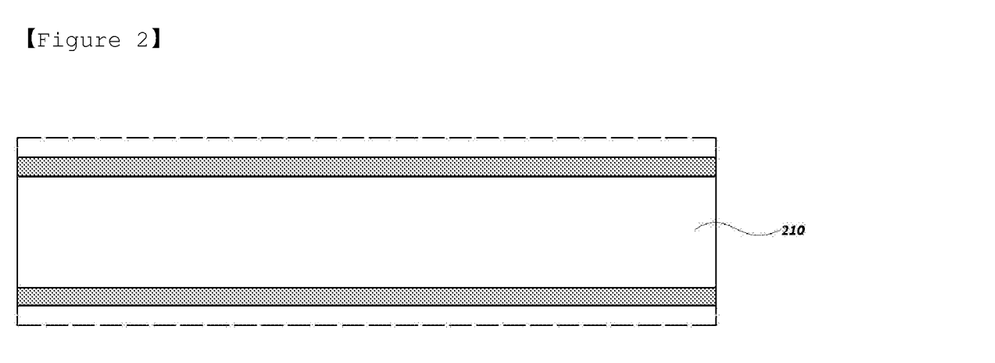
FIGS. 2 to 10 are schematic views showing a fabrication process of a conventional back contact solar cell.
Figure 3:
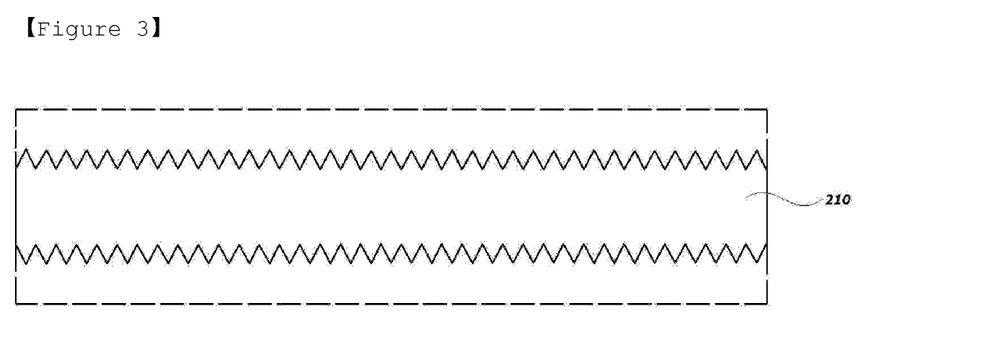

First, as shown in FIG. 2, a cut surface of an n-type silicon substrate 210 cut in a predetermined size is partially etched and prepared. Thereafter, as shown in FIG. 3, a texturing structure for minimizing reflectance of incident light is formed on at least one of an upper surface or a lower surface of the silicon substrate 210 using a base solution, etc.

Figure 4:
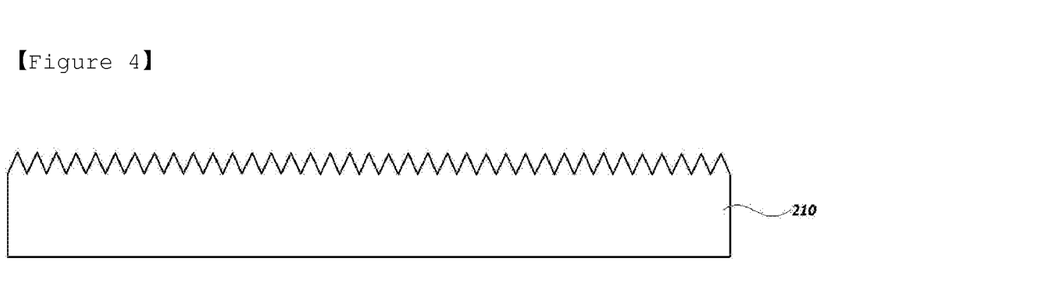

Thereafter, as shown in FIG. 4, a rear surface of the substrate 210 is finely polished for planarization.

Figure 5:
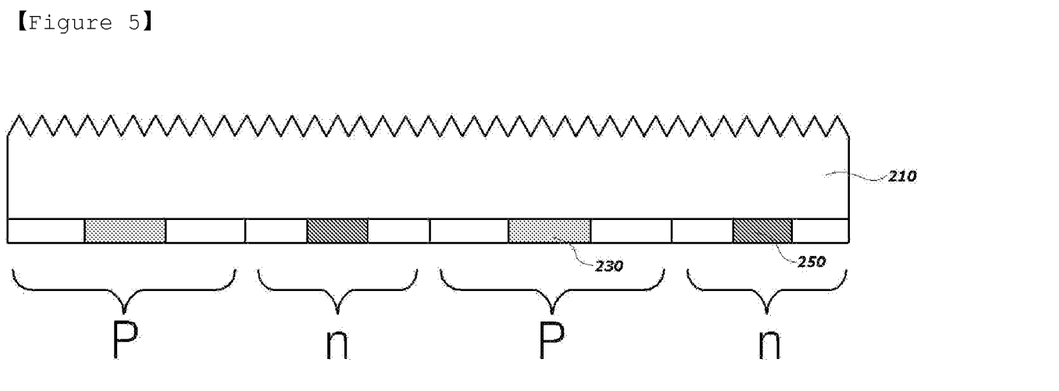
Figure 6:
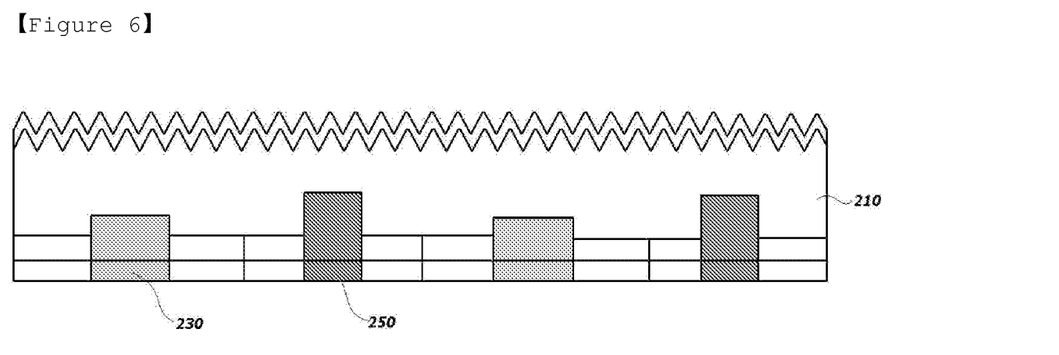

Next, as shown in FIG. 5, p-type dopant sources 230 and n-type dopant sources 250 are printed on the rear surface of the substrate 210 using a screen printer, etc. Thereafter, as shown in FIG. 6, the p-type dopant sources 230 and the n-type dopant sources 250 are diffused to form an n-type region and a p-type region, respectively.

Figure 7:
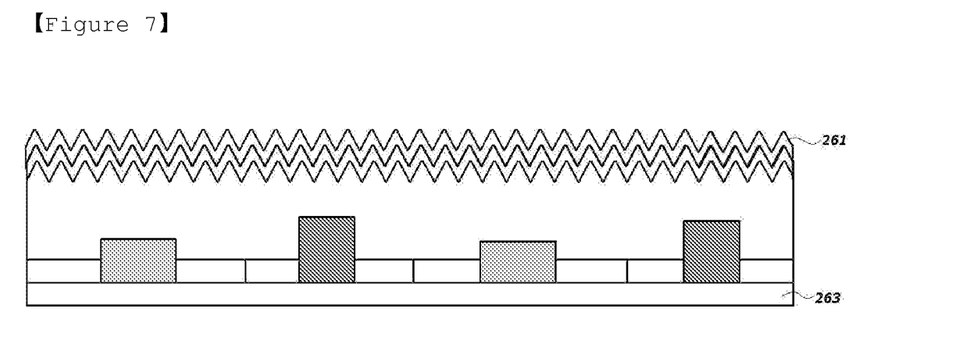
Figure 8:
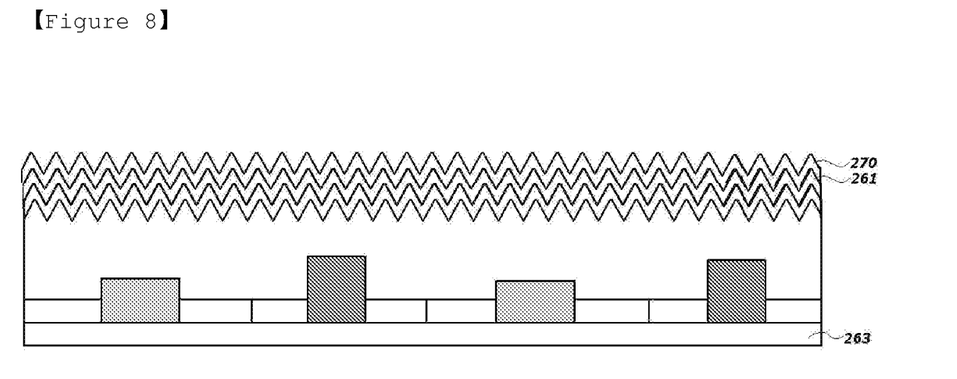

Next, as shown FIGS. 7 and 8, thermal oxide layers 261 and 263 for surface passivation and an anti-reflection coating 270 made of silicon nitride Si x, etc., are fanned on front and rear surfaces of the substrate 210.

Figure 9:
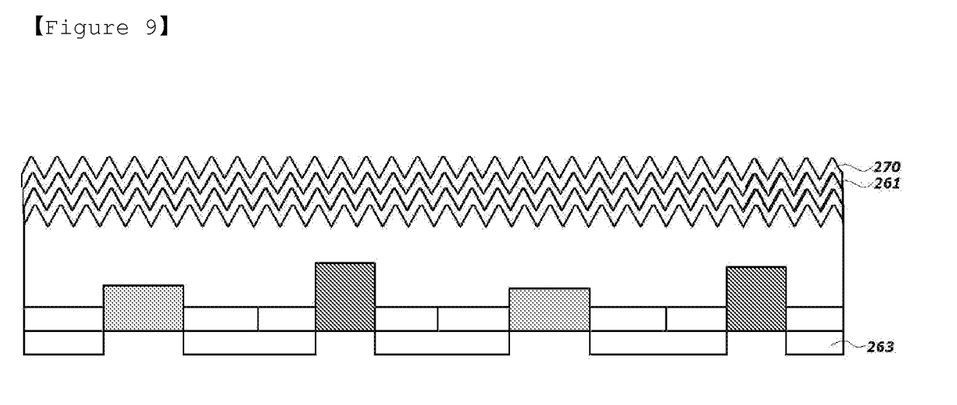

Next, as shown in FIG. 9, the oxide layer 263 formed on the rear surface of the substrate 210 is partially removed. This process is to form rear electrodes, that is, electrodes electrically contacting the p-type region and the n-type region. In this process, a photolithography process is used in order to remove the oxide layer 263.

More specifically, a photoresist is applied on the oxide layer 263, and a mask having a pattern corresponding to a region of the oxide layer 263 to be removed for formation of the rear electrodes is applied thereon and is exposed so that the oxide layer 263 is selectively removed.

Figure 10:
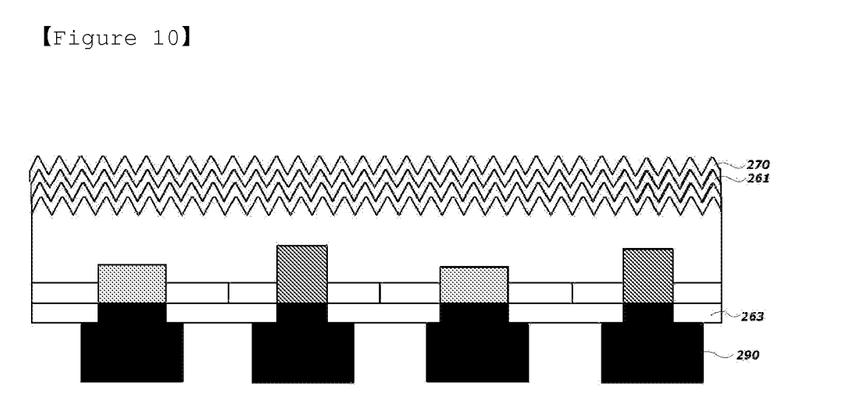

After partially removing the oxide layer 263 through this process, the rear electrodes 271 and 273 electrically connected to the p-type region and the n-type region are formed, as shown in FIG. 10, to complete the back contact solar cell.

The photolithography process is requisite for the fabrication process of such a conventional contact solar cell. That is, the rear electrodes have been formed in order to solve the problem of efficiency deterioration due to the shadowing of the conventional crystalline silicon solar cell; however, it is requisite to partially remove the oxide layer 263 in order to form the rear electrodes and to this end, the photolithography process should be performed.

Such a photolithography process is very complicated as well as causes an increase in process time and fabrication costs, thereby lowering fabrication efficiency of the back contact solar cell.

Therefore, it is very required to develop technology capable of solving the problem of a low efficiency due to the shadowing and at the same time, fabricating a back contact solar cell only by a simplified process.

SUMMARY OF THE INVENTION

The present invention has been proposed in order to solve the problem in the prior art as described above. It is an object of the present invention to provide a fabrication method of a back contact solar cell capable of obtaining effects such as rise in efficiency due to minimization of a shadowing effect, which is an original advantage of the back contact solar cell, reduction in recombination of electron-hole pairs due to the rear surface passivation, etc., and at the same time, accomplishing a simplified fabrication process and a low fabrication costs, by using a laser method instead of a complicated process such as photolithography, etc., conventionally used to form a pattern for formation of a p-type semiconductor region and an n-type semiconductor region comprised in a rear surface of the back contact solar cell.

In order to accomplish the above object, the present invention provides a fabrication method of a back contact solar cell having a plurality of different conductive type semiconductor regions on a rear surface of a first conductive type semiconductor substrate comprising the steps of: forming oxide layers on front and rear surfaces of the substrate; and removing the oxide layer by irradiating laser light to the oxide layer formed on the rear surface of the substrate at predetermined intervals to form a pattern of the different conductive type semiconductor regions.

The first conductive type semiconductor substrate may be changed according to a conductive type of dopant, and is not necessarily limited to a specific conductive type, but preferably may be a p-type silicon substrate.

In the present invention, the fabrication method of the back contact solar cell may further comprise the step of alternatively forming a first conductive type semiconductor region and a second conductive type semiconductor region by diffusing different conductive type dopants into the pattern formed at the predetermined intervals. The first conductive type semiconductor region and the second conductive type semiconductor region may be an n-type (n+) semiconductor region and a p-type (p+) semiconductor region, respectively.

A method forming the n-type semiconductor region is not specifically limited, but may be any one n-type dopant doping method selected from a group consisting of an ion implantation method, a thermal diffusion method, and a phosphorous oxychloride ($POCl_3$) diffusion method. More specifically, the n-type semiconductor region may be formed by a method inserting a p-type substrate into a high-temperature furnace and injecting an n-type impurity generation gas at a high concentration thereinto while heating temperature to 800 or 900° C., wherein the n-type impurity generation gas may preferably be phosphorous oxychloride ($POCl_3$).

Also, a method forming the p-type semiconductor region is not specifically limited, but the p-type semiconductor region may be formed by a screen printing method of a p-type dopant material.

The fabrication method of the back contact solar cell of the present invention may further comprise the step of forming metal electrodes on each of the first conductive type semiconductor region and the second conductive type semiconductor region after forming the first conductive type semiconductor region and the second conductive type semiconductor region.

The metal electrode may be formed by, but not necessarily limited to, a screen printing method.

In the fabrication method of the back contact solar cell of the present invention, a laser source used to irradiate the laser light is not specifically limited, but preferably may be a green laser source or an Nd/YAG laser source.

The fabrication method of the back contact solar cell of the present invention may further comprise the step of forming an anti-reflection coating on an upper surface of the oxide layer formed on the front surface of the substrate.

Also, the front and rear surfaces of the first conductive semiconductor substrate may have a texturing structure.

A fabrication method of a back contact solar cell having a plurality of different conductive type semiconductor regions on a rear surface of a p-type semiconductor substrate according to one embodiment of the present invention comprises the steps of: forming oxide layers on front and rear surfaces of the substrate; forming n-type semiconductor regions in a pattern in which the oxide layer is removed by irradiating laser light to the oxide layer formed on the rear surface of the substrate at predetermined intervals; forming p-type semiconductor regions in a pattern in which the oxide layer is removed by irradiating laser light to the oxide layer between then-type semiconductor regions at predetermined intervals from the n-type semiconductor region; and forming metal electrodes on each of the n-type semiconductor region and the p-type semiconductor region.

A back contact solar cell of the present invention comprises: a first conductive type semiconductor substrate having a front surface and a rear surface of a texturing structure; an oxide layer formed on the front surface of the substrate; at least one first conductive type semiconductor region and second conductive type semiconductor region alternatively formed at predetermined intervals on the rear surface of the substrate; an oxide layer formed on the remaining rear surface of the substrate except for the first conductive type semiconductor region and the second conductive type semiconductor region; and electrodes formed on each of the first conductive type semiconductor region and the second conductive type semiconductor region.

The first conductive type semiconductor substrate may be a p-type silicon substrate, and the first conductive type semiconductor region and the second conductive type semiconductor region may be an n-type (n+) semiconductor region and a p-type (P+) semiconductor region, respectively.

A resultant formed by oxidation will be sufficient as the oxide layer; however, the oxide layer preferably is silicon oxide ($SiO_2$) formed by rapid thermal oxidation (RTO). Also, the back contact solar cell may further comprise an anti-reflection coating on an upper surface of the oxide layer formed on the front surface of the substrate.

According to the fabrication method of the back contact solar cell of the present invention, it is possible to simplify a fabrication process, reduce fabrication time, and reduce fabrication costs by using the laser method instead of photolithography in fanning the pattern for formation of the p-type semiconductor region and then-type semiconductor region.

Also, it is possible to obtain effects such as a rise in efficiency due to minimization of the shadowing effect, which is an original advantage of the back contact solar cell, a reduction in recombination of electron-hole pairs due to rear surface passivation, etc.

BRIEF DESCRIPTION OF THE DRAWINGS

The above and other objects, features and advantages of the present invention will become apparent from the following description of preferred embodiments given in conjunction with the accompanying drawings, in which.

Hereinafter, embodiments of the present invention will be described in detail with reference to accompanying drawings.

DESCRIPTION OF THE EMBODIMENTS

FIGS. 11 to 17 are schematic views showing a fabrication process of a back contact solar cell according to one embodiment of the present invention. Hereinafter, the fabrication process of the back contact solar cell according to the present invention will be described with reference to FIGS. 11 to 17.

Figure 11:
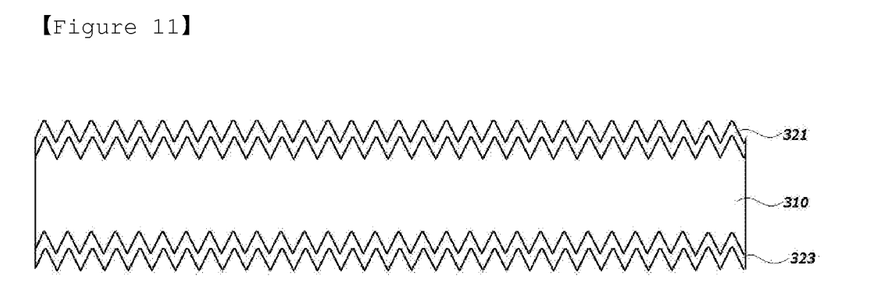
FIGS. 11 to 17 are schematic views showing a fabrication process of a back contact solar cell according to one embodiment of the present invention.

First, as shown in FIG. 11, a texturing structure is formed on at least one of a front surface and a rear surface of a p-type silicon substrate 310. The texturing structure may usually be formed in a pyramid shape, etc., and performs a function of reflecting solar light incident to the solar cell so that maximum light may be absorbed into an inside of the solar cell, thereby raising efficiency of the solar cell.

The texturing structure may be formed by etching using a known etching method. As an example, the texturing structure may be formed by immersing the silicon substrate 310 in a basic etching solution such as tetramethylammonium hydroxide (TMHA), potassium hydroxide (KOH), or sodium hydroxide (NaOH), etc., to which surfactant such as isopropyl alcohol (IPA), isopropyl ethanol (IPE), etc., is added.

After forming the texturing structure, thermal oxide layers 321 and 323 for surface passivation are formed on the front and rear surfaces of the silicon substrate 310. The passivation layers 321 and 323 have a role of stabilizing and protecting the surface and minimizing surface recombination of electron-hole pairs to increase efficiency of the solar cell.

These passivation layers 321 and 323 may be thermal oxide such as silicon oxide ($SiO_2$), etc., formed by a rapid thermal oxidation (RTO) scheme performed inside a furnace for rapid thermal processing (RTP), as described above. Also, the passivation layers 321 and 323 may be formed by a sputtering method using the silicon oxide ($SiO_2$) as a target material.

Figure 12:
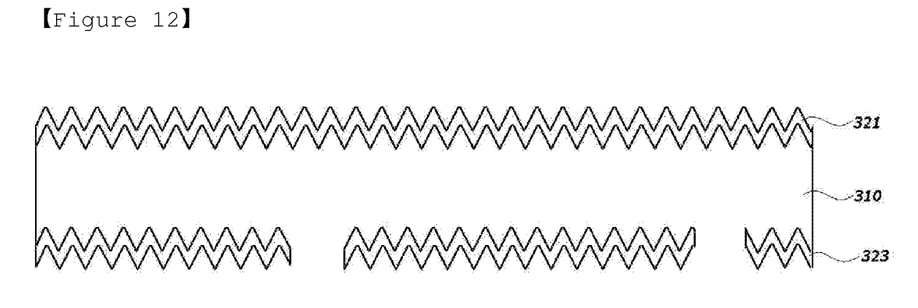

After forming the passivation layers 321 and 323, a pattern for diffusing an n-type material is formed on the rear surface of the silicon substrate 310, as shown in FIG. 12.

The formation of the pattern is to partially remove the oxidation layer 323 already formed on the rear surface of the silicon substrate 310, thereby making it possible to diffuse an n-type material through the removed portion.

A process forming the pattern by partially removing the oxide layer 323 may be performed by irradiating laser light. As a light source of the irradiated laser light, various light sources may be used; by way of example, a green laser source with a wavelength of about 532 nm, an Nd/YAG laser source with a wavelength of about 1064 nm, etc., may be used.

Figure 13:
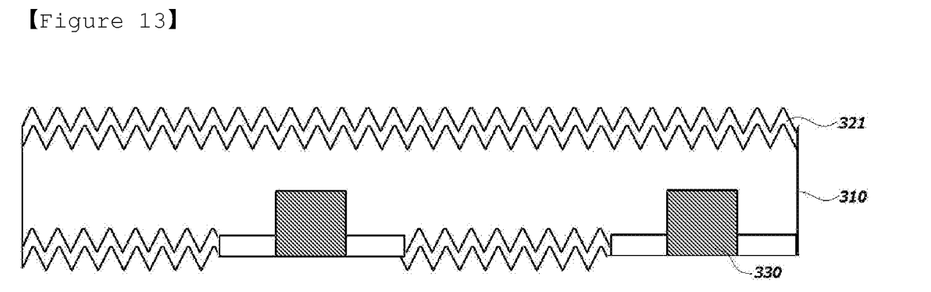

After partially removing the oxide layer 323, an n-type material 330 is diffused into portions at which the oxide layer 323 is removed, as shown in FIG. 13.

As a method diffusing the n-type material 33, a thermal diffusion method, etc., may be used. By way of example, a method performing doping by inserting the p-type silicon substrate 310 into a high-temperature furnace and flowing the n-type material (for example, $POCl_3$) into an inside of the furnace may be used.

Figure 14:
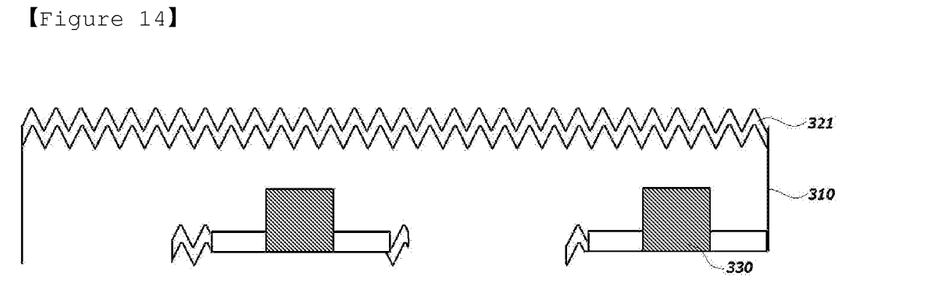

After diffusing the n-type material 330, the oxide layer 323 is removed in order to form a p-type semiconductor region in a region except for the region into which the n-type material is diffused, as shown in FIG. 14. At this time, a certain amount of the oxidation layer 323 is left in a region close to the region into which the n-type material 330 is diffused in order to insulate between the region into which the n-type material 330 is diffused and the p-type semiconductor region.

At this time, the oxide layer 323 may also be removed by irradiating green laser light with the wavelength of about 532 nm, Nd/YAG laser light with the wavelength of about 1064 nm, etc.

The oxide layer 323 left in order to isolate the region into which the n-type material is diffused and the p-type semiconductor region may perform a function of a rear passivation layer of the back contact solar cell. That is, the remaining oxide layer 323 protects the rear surface of the silicon substrate 310 as well as prevents rear surface recombination of electron-hole pairs so as to be able to contribute to improvement in efficiency of the solar cell.

Figure 15:
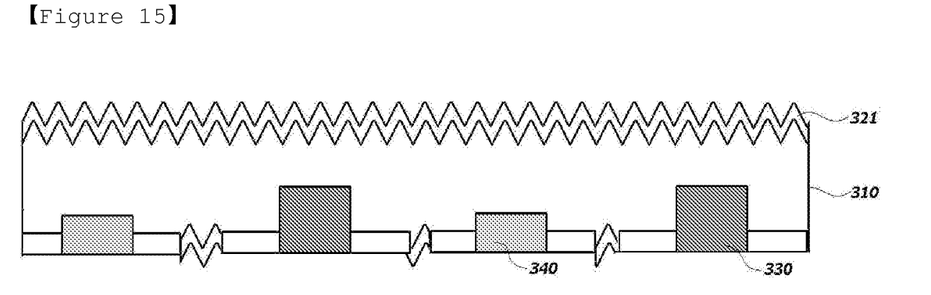

After removing all oxide layer 323 except for a certain amount of the oxide layer 323 for isolating the region into which the n-type material 330 is diffused and the p-type semiconductor region among the oxide layer 323 formed on the rear surface of the silicon substrate 310, the p-type semiconductor region 340 is formed by printing an aluminum (Al) metal, etc. in a region except for the region into which the n-type material is diffused, as shown in FIG. 15. The printing of the aluminum (Al) metal, etc., for forming the p-type semiconductor region 340 may be performed by a screen printing method, etc., which is a well-known printing method.

In fabrication of the back contact solar cell of the present invention, since the removal of oxide layer 323 required for diffusing the n-type material 330 and the removal of the oxide layer 323 required for forming the p-type semiconductor region 340 are performed by irradiating the laser light, it is possible to omit a photolithography process requisitely used to remove the oxide layer on the rear surface of the conventional back contact solar cell. Since the photolithography process, which is a complicated and expensive process, may be omitted, it is possible to simplify the fabrication process of the back contact solar cell and also reduce fabrication costs.

Figure 16:
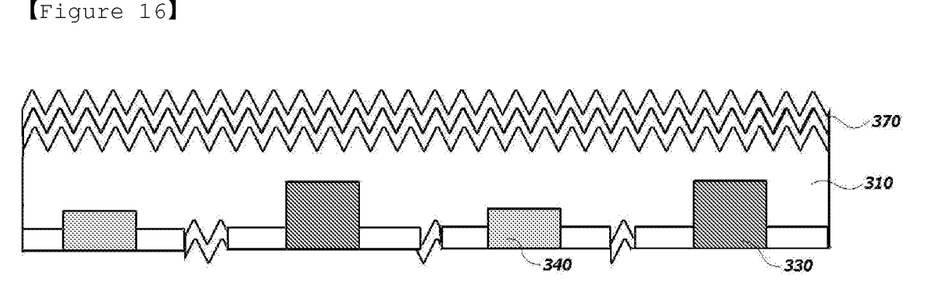

After forming the p-type semiconductor region 340, an anti-reflection coating 370 is formed on an upper surface of the oxide layer 321 formed on the front surface of the p-type silicon substrate 310, as shown in FIG. 16. The anti-reflection coating 370 may be deposited using a deposition method such as a plasma enhanced chemical vapor deposition (PECVD) method, a sputtering method, or a spin coating method, etc., and be made of a material such as silicon nitride (SiNO$_x$) or titanium dioxide (TiO$_2$), etc. This anti-reflection coating 370 may have a function of minimizing reflectance of the solar cell and at the same time, perform a function of a passivation layer. Accordingly, defects of the back contact solar cell are minimized and recombination of electron-hole pairs is further reduced, so that the efficiency of the solar cell may be improved.

Figure 17:
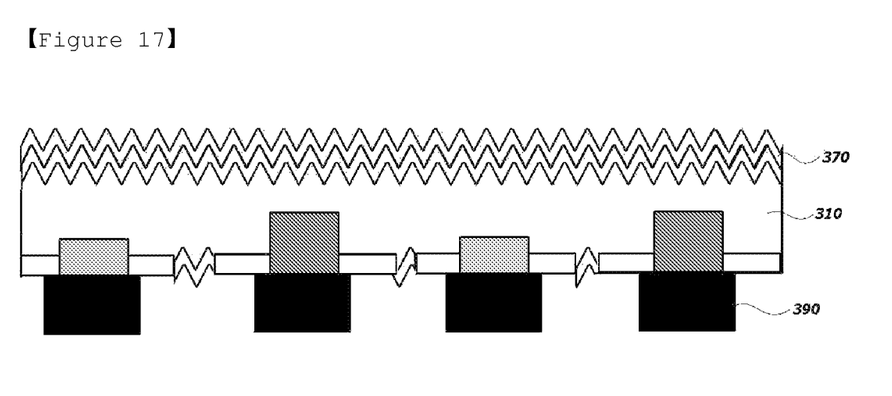

After forming the anti-reflection coating 370, electrodes are printed on each of the regions into which the n-type material is diffused and the p-type semiconductor region 340 to form rear electrodes 390, thereby completing the back contact solar cell, as shown in FIG. 17. As the electrode 390, a metal with a high conductivity such as silver (Ag), etc., may be used.

Although the present invention has been illustrated with regard to specific details such as specific components, etc., limited embodiments, and drawings, the specific details such as specific components, etc., the limited embodiments, and the drawings are only provided in order to assist overall understanding of the present invention. The prevent invention is not limited to the above embodiment, but may be variously modified and altered by those skilled in the art.

Therefore, a technical idea of the present invention is not limited to the above-mentioned embodiment and claims described below and equivalents thereof are within a scope of the technical idea of the present invention.

According to the fabrication method of the back contact solar cell of the present invention, it is possible to simplify a fabrication process, reduce fabrication time, and reduce fabrication costs by using the laser method instead of photolithography in forming the pattern for formation of the p-type semiconductor region and the n-type semiconductor region.

Also, it is possible to obtain effects such as a rise in efficiency due to minimization of the shadowing effect, which is an original advantage of the back contact solar cell, a reduction in recombination of electron-hole pairs due to rear surface passivation, etc.

What is claimed is:

1. A fabrication method of a back contact solar cell having a plurality of different conductive type semiconductor regions on a rear surface of a semiconductor substrate having a first conductive type, the method comprising:
    forming a pyramid-shaped front texturing structure and a pyramid-shaped rear texturing structure at front and rear surfaces, respectively, of the semiconductor substrate;
    forming thermal oxide layers on the front and rear surfaces, respectively, of the semiconductor substrate at the pyramid-shaped front and rear texturing structures;
    forming first patterns by locally removing the thermal oxide layer formed on the rear surface of the semiconductor substrate at predetermined intervals, wherein the pyramid-shaped rear texturing structure is not present where the thermal oxide layer is partially removed;
    forming first conductive type semiconductor regions on the rear surface of the semiconductor substrate through the first patterns;
    forming, subsequent to the forming the first conductive type semiconductor regions, second patterns by locally removing the thermal oxide layer on the rear surface of the semiconductor substrate that remains at the predetermined intervals with the first patterns, wherein the pyramid-shaped rear texturing structure is not present where the thermal oxide layer is partially removed;
    forming second conductive type semiconductor regions on the rear surface of the semiconductor substrate through the second patterns; and
    forming first electrodes through the first patterns and second electrodes through the second patterns, wherein the first electrodes are in direct contact with the first conductive type semiconductor regions, and the second electrodes are in direct contact with the second conductive type semiconductor regions.

2. The fabrication method of the back contact solar cell according to claim 1, wherein the first electrodes or the second electrodes are formed by a screen printing method.

3. The fabrication method of the back contact solar cell according to claim 1, wherein in the forming of the first patterns or the second patterns, the thermal oxide layer on the rear surface of the semiconductor substrate is removed by irradiating a laser light to the thermal oxide layer.

4. The fabrication method of the back contact solar cell according to claim 3, wherein a laser source used to irradiate the laser light is a green laser source or an Nd/YAG laser source.

5. The fabrication method of the back contact solar cell according to claim 1, wherein the pyramid-shaped front texturing structure or the pyramid-shaped rear texturing structure is formed via etching by immersing the semiconductor substrate in an etching solution.

6. The fabrication method of the back contact solar cell according to claim 1, wherein the thermal oxide layers on the front and rear surfaces, respectively, of the semiconductor substrate are formed using a rapid thermal oxidation scheme in a rapid thermal processing furnace or by a sputtering method using silicon oxide as a target material.

7. The fabrication method of the back contact solar cell according to claim 1, wherein the first conductive type semiconductor regions are formed by thermal diffusion in a high-temperature furnace by flowing a first conductive type material into an inside of the high-temperature furnace to dope the first conductive type material at the first patterns.

8. The fabrication method of the back contact solar cell according to claim 1, wherein after the second conductive type semiconductor regions are formed, the pyramid-shaped rear texturing structure remains only between the first conductive type semiconductor regions and the second conductive type semiconductor regions at the rear surface of the semiconductor substrate.

9. The fabrication method of the back contact solar cell according to claim 1, wherein the first conductive type semiconductor regions and the second conductive type semiconductor regions are respectively formed by different doping methods.

10. The fabrication method of the back contact solar cell according to claim 1, wherein the second conductive type semiconductor regions are formed by a dopant screen printing to print a second conductive type material to dope the second conductive type material at the second patterns.

11. The fabrication method of the back contact solar cell according to claim 10, wherein the second conductive type semiconductor regions are p-type semiconductor regions, and the second conductive type material is aluminum.

12. The fabrication method of the back contact solar cell according to claim 1, wherein the first conductive type semiconductor regions are formed by thermal diffusion, and in the thermal diffusion of forming the first conductive type semiconductor regions, the thermal oxide layer at the rear surface of the semiconductor substrate acts as a mask for protecting portions corresponding to the second conductive type semiconductor regions at the rear surface of the semiconductor substrate.

13. The fabrication method of the back contact solar cell according to claim 1, wherein after the forming of the second patterns, the thermal oxide layer at the rear surface remains between the first patterns and the second patterns and acts as a rear protection layer.

14. The fabrication method of the back contact solar cell according to claim 1, wherein after the second conductive type semiconductor regions are formed, the thermal oxide layer remaining on the rear surface is spaced apart so as not to overlap the first conductive type semiconductor regions and the second conductive type semiconductor regions in a vertical direction.

15. The fabrication method of the back contact solar cell according to claim 1, wherein the first electrodes are formed so as to cover an entire surface of the first conductive type semiconductor regions and extend over an adjacent portion of the thermal oxide layer at the rear surface of the semiconductor substrate, and the second electrodes are formed so as to cover an entire surface of the second conductive type semiconductor regions and extend over an adjacent portion of the thermal oxide layer at the rear surface of the semiconductor substrate.

16. The fabrication method of the back contact solar cell according to claim 1, further comprising: forming an anti-reflection coating on an upper surface of the thermal oxide layer formed on a font surface of the semiconductor substrate from among the thermal oxide layers.

17. The fabrication method of the back contact solar cell according to claim 16, wherein the first electrodes and the second electrodes are formed subsequent to the forming the anti-reflection coating.

18. The fabrication method of the back contact solar cell according to claim 1, wherein intervals between the first conductive type semiconductor regions and the second conductive type semiconductor regions have portions that are without the pyramid-shaped rear texturing structure of the rear surface of the semiconductor substrate.

19. The fabrication method of the back contact solar cell according to claim 1, wherein an entire surface of the first conductive type semiconductor regions is equal to an exposed surface formed by openings formed by the first patterns, and an entire surface of the second conductive type semiconductor regions is equal to an exposed surface formed by openings formed by the second patterns, and
wherein the entire surface of the first conductive type semiconductor regions and the entire surface of the second conductive type semiconductor regions are parallel to the rear surface of the semiconductor substrate.

20. A fabrication method of a back contact solar cell having n-type semiconductor regions and p-type semiconductor regions on a rear surface of a semiconductor substrate having an n-type doping, the method comprising:
forming a pyramid-shaped front texturing structure and a pyramid-shaped rear texturing structure at front and rear surfaces, respectively, of the semiconductor substrate;
forming thermal oxide layers on the front and rear surfaces, respectively, of the semiconductor substrate at the pyramid-shaped front and rear texturing structures;
forming first patterns by locally removing the thermal oxide layer formed on the rear surface of the semiconductor substrate at predetermined intervals, wherein the pyramid-shaped rear texturing structure is not present where the thermal oxide layer is partially removed;
forming n-type semiconductor regions on the rear surface of the semiconductor substrate through the first patterns;
forming, subsequent to the forming the n-type semiconductor regions, second patterns by locally removing the thermal oxide layer on the rear surface of the semiconductor substrate that remains at the predetermined intervals with the first patterns, wherein the pyramid-shaped rear texturing structure is not present where the thermal oxide layer is partially removed;
forming p-type semiconductor regions on the rear surface of the semiconductor substrate through the second patterns; and
forming first electrodes through the first patterns and second electrodes through the second patterns, wherein the first electrodes are in direct contact with the n-type semiconductor regions, and the second electrodes are in direct contact with the p-type semiconductor regions.

* * * * *